US009461002B2

(12) United States Patent
Croon et al.

(10) Patent No.: US 9,461,002 B2
(45) Date of Patent: Oct. 4, 2016

(54) SEMICONDUCTOR DEVICE (71) Applicant: NXP B.V., Eindhoven (NL)

(72) Inventors: Jeroen Antoon Croon, Eindhoven (NL); Coenraad Cornelis Tak, Waalre (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/874,189

(22) Filed: Oct. 2, 2015

(65) Prior Publication Data

US 2016/0163653 A1 Jun. 9, 2016

(30) Foreign Application Priority Data

Dec. 3, 2014 (EP) .................................. 14196049

(51) Int. Cl.
*H01L 29/15* (2006.01)
*H01L 23/552* (2006.01)
(Continued)

(52) U.S. Cl.
CPC ......... *H01L 23/552* (2013.01); *H01L 21/4853* (2013.01); *H01L 23/49811* (2013.01); *H01L 23/49844* (2013.01); *H01L 23/49861* (2013.01); *H01L 24/49* (2013.01); *H01L 29/205* (2013.01); *H01L 29/872* (2013.01); *H01L 23/3121* (2013.01); *H01L 23/481* (2013.01); *H01L 24/05* (2013.01); *H01L 24/29* (2013.01); *H01L 24/32* (2013.01); *H01L 24/48* (2013.01); *H01L 24/73* (2013.01); *H01L 2224/04042* (2013.01); *H01L 2224/0557* (2013.01); *H01L 2224/05553* (2013.01); *H01L 2224/05568* (2013.01); *H01L 2224/2919* (2013.01); *H01L 2224/32225* (2013.01); *H01L 2224/32245* (2013.01); *H01L 2224/48091* (2013.01); *H01L 2224/48227* (2013.01); *H01L 2224/48237* (2013.01); *H01L 2224/48247* (2013.01); *H01L 2224/48257* (2013.01); *H01L 2224/49111* (2013.01); *H01L 2224/49171* (2013.01); *H01L 2224/49175* (2013.01); *H01L 2224/49433* (2013.01);
(Continued)

(58) Field of Classification Search
CPC ........................... H01L 23/552; H01L 23/481
USPC ........................................................ 257/76
See application file for complete search history.

(56) References Cited

U.S. PATENT DOCUMENTS

2006/0071271 A1 4/2006 Omura et al.
2007/0228401 A1 10/2007 Machida et al.
2009/0206812 A1 8/2009 Sasaya et al.

OTHER PUBLICATIONS

Extended European Search Report for EP Patent Appln. No. 14196049.2 (Jul. 2, 2015).

*Primary Examiner* — Douglas Menz (57) ABSTRACT

A semiconductor device and a method of making the same. The semiconductor device includes a semiconductor substrate mounted on a carrier. The semiconductor substrate includes a Schottky diode. The Schottky diode has an anode and a cathode. The semiconductor device also includes one or more bond wires connecting the cathode to a first electrically conductive portion of the carrier. The semiconductor device further includes one or more bond wires connecting the anode to a second electrically conductive portion of the carrier. The first electrically conductive portion of the carrier is electrically isolated from the second electrically conductive portion of the carrier. The first electrically conductive portion of the carrier is configured to provide shielding against electromagnetic interference associated with switching of the anode during operation of the device. Both the cathode and the first electrically conductive portion of the carrier are electrically isolated from a backside of the semiconductor substrate.

15 Claims, 8 Drawing Sheets (51) Int. Cl.
  *H01L 23/498* (2006.01)
  *H01L 29/872* (2006.01)
  *H01L 21/48* (2006.01)
  *H01L 29/205* (2006.01)
  *H01L 23/31* (2006.01)
  *H01L 23/48* (2006.01)
  *H01L 23/00* (2006.01)

(52) U.S. Cl.
  CPC ............... *H01L2224/73265* (2013.01); *H01L 2924/00014* (2013.01); *H01L 2924/1033* (2013.01); *H01L 2924/10253* (2013.01); *H01L 2924/10272* (2013.01); *H01L 2924/10344* (2013.01); *H01L 2924/12032* (2013.01); *H01L 2924/15313* (2013.01); *H01L 2924/19107* (2013.01); *H01L 2924/3025* (2013.01)

SEMICONDUCTOR DEVICE

CROSS-REFERENCE TO RELATED APPLICATIONS

This application claims the priority under 35 U.S.C. §119 of European patent application no. 14196049.2, filed on Dec. 3, 2014, the contents of which are incorporated by reference herein.

FIELD OF THE INVENTION

This invention relates to a semiconductor device and to a method of making a semiconductor device.

BACKGROUND OF THE INVENTION

Schottky diodes, also known as Schottky-barrier diodes, are well known devices that can be used in a number of applications, including rectification in power supplies and voltage clamping. Recently, Schottky diodes comprising layers of GaN and AlGaN provided on a semiconductor substrate have drawn a lot of attention in view of their potential for replacing conventional silicon (Si) or silicon carbide (SiC) based devices for high voltage applications.

Figure 1A:
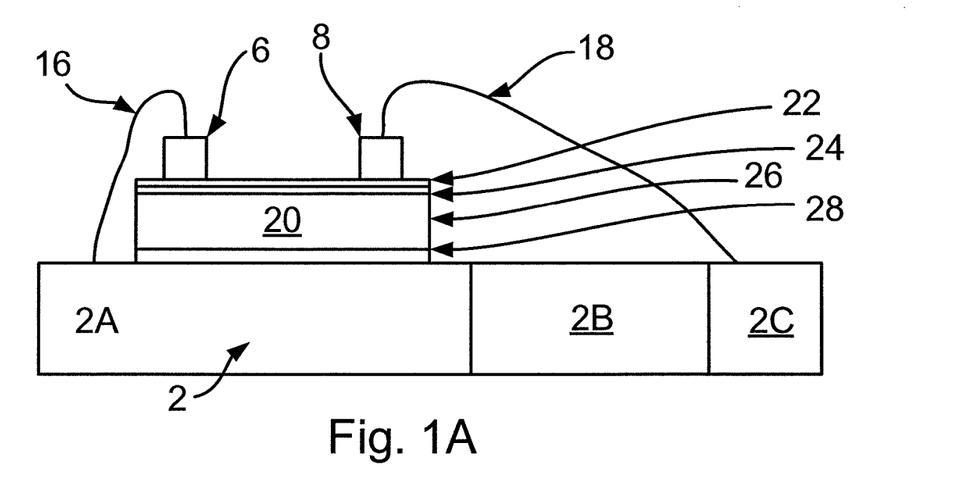
FIG. 1A shows a side view of an example of a semiconductor device including a Schottky diode.
Figure 1B:
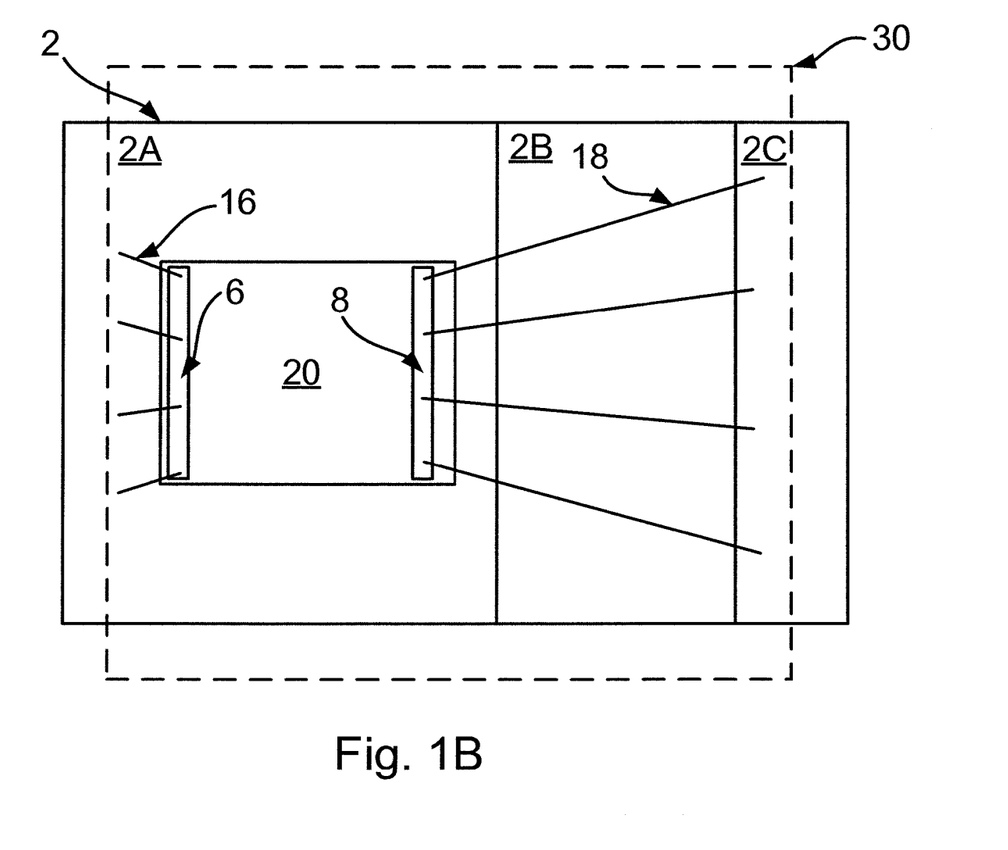
FIG. 1B shows a top view of the device of FIG. 1.

A Schottky diode generally includes of a Schottky contact (the anode) and an ohmic contact (the cathode) that are both provided on a semiconductor substrate having one or more layers. One example of a semiconductor device comprising a Schottky diode is shown in FIGS. 1A and 1B. Note that FIG. 1A is a side view of the device, while FIG. 1B is a top view.

The device in FIGS. 1A and 1B includes a semiconductor substrate 20 including a plurality of layers. Layer 24 is a GaN layer while layer 22 comprises AlGaN. As is well known in the art, formation of a high mobility two-dimensional electron gas at the interface between the GaN layer 24 and the AlGaN layer 22 provides the basis for current flow within the diode and in particular can allow for low on-state resistance. The substrate also has a plurality of stress relieving layers shown generally at 26. The stress relieving layers 26 are provided to reduce stress within the substrate 20 associated with the fact that the lattice parameters of the GaN layer 24 are typically different to those of the material forming the underlying region of the substrate 20, including the backside of the substrate shown generally at 28.

The device further includes a semiconductor package that comprises a lead frame 2 and an encapsulant (which is indicated schematically by the dashed line labelled 30 in FIG. 1B). The backside 28 of the substrate 20 is attached to an electrically conductive (typically metallic) part 2A of the lead frame 2.

The Schottky diode has a cathode 6 and an anode 8. A group of bond wires 16 are used to make connections to the cathode 6, and another group of bond wires 18 are used to make connections to the anode 18. In particular, the cathode 6 of the device is connected by the bond wires 16 to the electrically conductive part 2A of the lead frame 2, and the anode 8 of the device is connected by the bond wires 18 to another electrically conductive part 2C of the lead frame 2. The electrically conductive parts 2A and 2C may be connected to output pins of the package (this is represented schematically in FIG. 1B by the portions of the conductive parts 2A and 2C that extend out from the encapsulant 30). Note that electrically conductive parts 2A and 2C are electrically isolated from each other by an isolation region 2B, which may comprise a dielectric material. Bond wires 18 extend across the isolation region 2B to connect the anode 8 to the electrically conductive part 2C. The encapsulant 30 can be used to secure and protect the substrate 20 and the bond wires 16, 18, as is well known in the art.

In use, the voltage on the anode 8 switches between a large negative voltage (with respect to the cathode voltage, which is normally grounded) in a non-conductive state and a low, positive anode-voltage, which causes a large forward current to flow in an on-state of the device.

As noted above, the substrate 20 shown in FIG. 1A is normally attached to the electrically conductive part 2A of the lead frame, such that the backside 28 of the substrate 20 is in electrical communication with the conductive part 2A. Since the cathode 6 of the device is also connected to the conductive part 2A of the lead frame 2 by the bond wire 16, it follows that the cathode 6 of the device is in electrical communication with the backside 28 of the substrate 20. The connection between the conductive part 2A of the lead frame 2 and the cathode 6 can reduce or prevent electromagnetic radiation associated with switching of the anode 8, which turn may otherwise cause electromagnetic interference (EMI).

SUMMARY OF THE INVENTION

Aspects of the invention are set out in the accompanying independent and dependent claims. Combinations of features from the dependent claims may be combined with features of the independent claims as appropriate and not merely as explicitly set out in the claims.

According to an aspect of the invention, there is provided a semiconductor device. The semiconductor device includes a semiconductor substrate mounted on a carrier. The semiconductor substrate includes a Schottky diode. The Schottky diode has an anode and a cathode. The semiconductor device also includes one or more bond wires connecting the cathode to a first electrically conductive portion of the carrier. The semiconductor device further includes one or more bond wires connecting the anode to a second electrically conductive portion of the carrier. The first electrically conductive portion of the carrier is electrically isolated from the second electrically conductive portion of the carrier. The first electrically conductive portion of the carrier is configured to provide shielding against electromagnetic interference associated with switching of the anode during operation of the device. Both the cathode and the first electrically conductive portion of the carrier are electrically isolated from a backside of the semiconductor substrate.

According to another aspect of the invention, there is provided a method of making a semiconductor device. The method includes mounting a semiconductor substrate on a carrier, the substrate including a Schottky diode, the Schottky diode having an anode and a cathode. The method also includes connecting the cathode to a first electrically conductive portion of the carrier using one or more bond wires. The method further includes connecting the anode to a second electrically conductive portion of the carrier using one or more bond wires. The first electrically conductive portion of the carrier is electrically isolated from the second electrically conductive portion of the carrier. The first electrically conductive portion of the carrier is configured to provide shielding against electromagnetic interference associated with switching of the anode during operation of the device. Both the cathode and the first electrically conductive portion of the carrier are electrically isolated from a backside of the semiconductor substrate.

According to embodiments of this invention, shielding may be provided against electromagnetic interference associated with switching of the anode of the Schottky during operation of the device. Moreover, by providing a semiconductor device in which both the cathode and the first electrically conductive portion of the carrier (which is configured to provide the shielding) are electrically isolated from a backside of the substrate, it has been found that the performance of the diode may be enhanced. For example, the deleterious effect on device performance associated with current collapse may be reduced.

Various configurations of the first electrically conductive portion of the carrier are envisaged for providing shielding against electromagnetic interference associated with switching of the anode during operation of the device. In one example, the first electrically conductive portion of the carrier may extend at least partially around a periphery of the substrate. In another example, the first electrically conductive portion of the carrier extends at least partially (or completely) beneath the substrate to provide the shielding.

In some embodiments, the anode may be electrically connected to the backside of the semiconductor substrate. The unwanted reduction in current associated with the current collapse phenomenon has been found to be particularly reduced when the anode is connected to the backside. This is discussed in more detail below in relation to, for example, FIG. 3.

Connection of the anode to the backside of the substrate may be achieved in a number of ways. For instance, the anode may be electrically connected to the backside of the semiconductor substrate by an electrically conductive connection, such as a via filled with an electrically conductive material, passing through the semiconductor substrate. In another embodiment, the backside of the semiconductor substrate may be mounted on an electrically conductive mounting portion that is isolated from both the cathode and the first electrically conductive portion of the carrier. The anode may be electrically connected to the electrically conductive mounting portion, for example by a down-bond wire. It is envisaged that the approaches set out above may be combined and are not mutually exclusive alternatives.

In some embodiments, the carrier may include a lead frame. In some embodiments, the carrier may include a dielectric substrate having metallized layers. The metallized layers may be located at different levels in or on the dielectric substrate. The dielectric substrate may also have electrical connections passing through the dielectric substrate for electrically interconnecting the metallized layers.

The backside of the semiconductor substrate may be electrically connected to an output connection for applying a potential to the backside of the substrate. This may allow the backside of the substrate to be held at a predetermined voltage (e.g. ground), while the anode is switched.

The backside of the substrate may be electrically isolated from the carrier by an intervening dielectric, such as a dielectric layer or an adhesive. This may allow the electrical isolation of the backside and the cathode to be achieved even where the substrate is mounted on an electrically conductive part of the carrier to which the cathode is electrically connected.

The first electrically conductive portion of the carrier may be electrically isolated from the second electrically conductive portion of the carrier by a mould compound. The first and second electrically conductive portions of the carrier may be connected to separate outputs (e.g. output pins) of the device.

The Schottky diode may be a GaN/AlGaN diode.

According to a further aspect of the invention, there is provided a power amplifier including a semiconductor device of the kind described above.

BRIEF DESCRIPTION OF THE DRAWINGS

Embodiments of the present invention will be described hereinafter, by way of example only, with reference to the accompanying drawings in which like reference signs relate to like elements and in which.

DETAILED DESCRIPTION

Embodiments of the present invention are described in the following with reference to the accompanying drawings.

Embodiments of this invention can provide a semiconductor device that includes a semiconductor substrate including a Schottky diode, the substrate being mounted on a carrier. The carrier may form part of a package of the semiconductor device. In other examples, the carrier may be part of a larger module in which the semiconductor device is provided. As will be described in more detail below, examples of carriers that may be used include (i) lead frames and (ii) dielectric substrates that are provided with metallised features such as one or more metal layers interconnected by metal filled vias.

According to embodiments of this invention, shielding may be provided against electromagnetic interference associated with switching of the anode of the Schottky during operation of the device. In particular, the shielding may be provided by a first electrically conductive portion of the carrier. The first electrically conductive portion of the carrier may be configured (e.g. shaped) to at least partially surround or enclose the substrate.

The Schottky diode has an anode and a cathode. Bond wires are typically used to make electrical connections to the anode and the cathode, for allowing electrical potentials to be applied thereto during operation. According to embodiments of this invention, the electromagnetic shielding provided by the first electrically conductive portion is implemented in a manner that ensures that the cathode and the first electrically conductive portion are electrically isolated from a backside of the semiconductor substrate. As will be described in more detail below, the electrical isolation of the cathode from the backside of the substrate can improve the performance of the device by lessening the effects of current collapse within the device.

As will also be discussed in more detail below, the isolation of the cathode from the backside of the substrate can be achieved in a number of different ways, while still allowing appropriate electrical connections to the cathode and the anode to be made.

As noted above in relation to FIGS. 1A and 1B, in devices in which the cathode is electrically connected to a lead frame, where the backside of the substrate is also electrically connected to the lead frame, the effects of electromagnetic interference (EMI) associated with switching of the anode can be reduced. However, it has been found that by connecting the cathode to the backside of the substrate, performance of the device can be degraded due to current collapse within the device.

Figure 2:
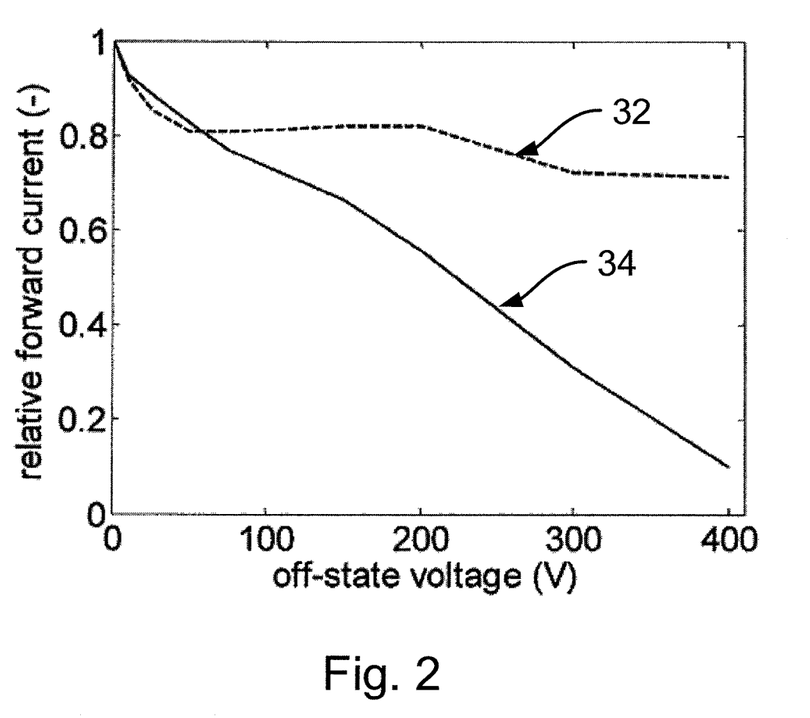
FIG. 2 compares the relative forward current in a Schottky diode having a cathode to backside connection with a Schottky diode having an anode to backside connection.

FIG. 2 illustrates the effect of current collapse for a device in which the cathode is connected to the backside of the substrate (see the plot labelled 34). For illustrative purposes, FIG. 2 also indicates the effect of current collapse on a device in which the backside of the semiconductor substrate is, in accordance with an embodiment of this invention, not connected to the cathode but is instead electrically connected to the anode of the device (see the plot labelled 32). The data were obtained using measurements carried out on test wafers (not on packaged devices). Examples of devices in which the backside of the semiconductor substrate is electrically connected to the anode of the device will be described in more detail below.

In Schottky diodes such as GaN Schottky diodes, the forward current after switching the device on from the off-state may be lower than the forward current for DC operation. This phenomenon is known as current collapse. The vertical axis in FIG. 2 illustrates the relative forward current of the device (defined as the forward current after off-state voltage-stress relative to the forward current without off-voltage-stress (i.e. DC operation), while the horizontal axis in FIG. 2 relates to the off-state-voltage. It is clear in FIG. 2 that in the case where the cathode of the device is connected to the backside of the substrate, the forward current after off-state of the device relative to the forward current in DC operation is dramatically reduced, especially at higher off-state voltages. In contrast, although there is some reduction in relative forward current in a device in which the anode is connected to the backside of the substrate, it is clear that the reduction is not as great as in a device where the cathode is connected to the backside.

In accordance with embodiments of this invention, there are a number of options relating to the electrical potential at the backside of the substrate during operation of the device. For instance, and as already described above, the backside may be connected to the anode. In other embodiments, the backside may be left floating. In further embodiments, a dedicated connection to the backside may be made, for instance so that a predetermined voltage (such as a ground potential) may be applied to the backside. The embodiments of the invention described herein below provide various implementations of these approaches.

Figure 3A:
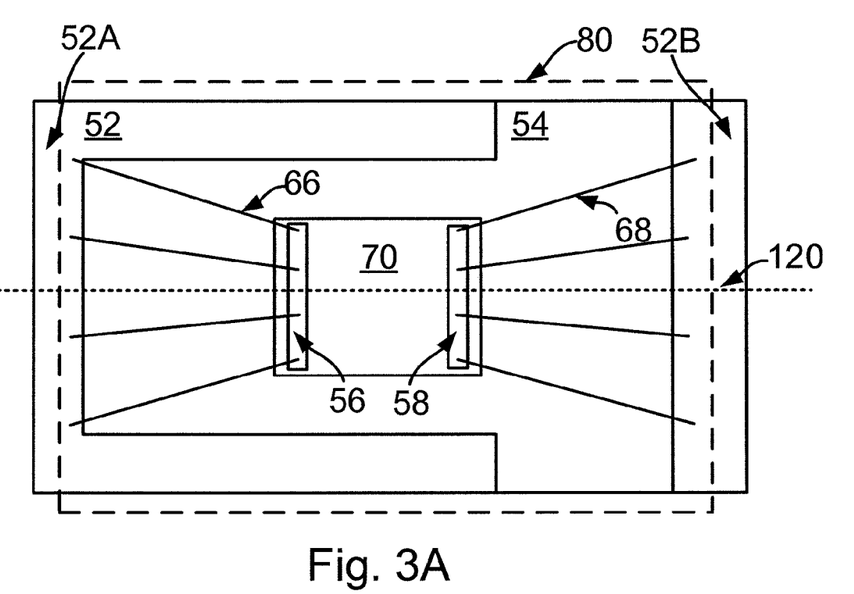
FIG. 3A shows a top view of a semiconductor device in accordance with an embodiment of the invention.
Figure 3B:
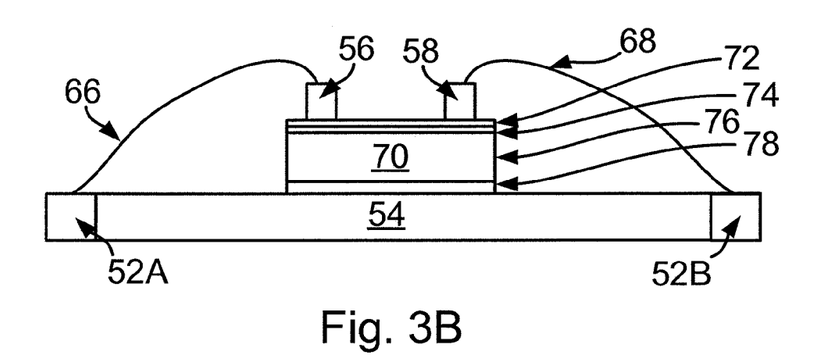
FIGS. 3B and 3C each show a cross section of an example of a semiconductor device of the kind shown in FIG. 3A.

FIG. 3A illustrates a semiconductor device according to a first embodiment of this invention. FIG. 3B shows a cross-section of the device of FIG. 3A, along the dotted line in FIG. 3A labelled 120. The semiconductor device includes a semiconductor substrate 70. The semiconductor substrate 70 is mounted on a carrier 52, which in this example comprises a lead frame having a first electrically conductive portion 52A, a second electrically conductive portion 52B and an isolating portion 54, which electrically isolates the first and second electrically conductive portions 52A, 52B from each other. The isolating portion 54 can, for example, comprise a dielectric such as a mould compound (encapsulant) of a package 80 of the semiconductor device. The package 80 of the device is shown schematically in FIG. 3A by the dashed line labelled 80. As can be seen in FIG. 3A, the portions 52A and 52B of the carrier 52 extend at least partially out from the package 80. This schematically represents that external electrical connections (e.g. output pins) may be connected to the electrically conductive portions 52A, 52B of the device for subsequent electrical connection to the diode.

The semiconductor substrate includes a Schottky diode. The Schottky diode has a cathode 56 and an anode 58. The cathode 56 in this example is connected to the electrically conductive portion 52A of the carrier 52 using bond wires 66. Similarly, the anode 58 is connected to the electrically conductive portion 52B of the carrier 52 by one or more bond wires 68.

The Schottky diode may include a AlGaN layer 72 that is located on top of a GaN layer 74. As is known in the art, this combination of layers leads to the formation of a two dimensional electron gas at the interface between the layers 72 and 74. The two dimensional electron gas has high mobility. Conduction of the two dimensional electron gas forms the basis for current flow within the Schottky diode.

The cathode 56 and anode 58 are provided on a surface of the AlGaN layer 72. Typically, the anode 58 is a Schottky contact, while the cathode 56 is an ohmic contact. During operation, the cathode 56 may, for example, be held at a predetermined potential (for instance, a ground potential) while the anode 58 is switched between a large negative potential and a small positive potential in the on-state. These potentials may be applied to the cathode 56 and the anode 58 using the electrical connections provided by the bond wires 66 and 68 respectively.

The semiconductor substrate 70 may also include buffer layers 76 for matching the lattice constant of the GaN layer 74 with the underlying part of the substrate 70.

A backside 78 of the substrate 70 is, in this example, mounted directly on the carrier 52. In particular, the backside 78 is mounted on the isolation portion 54, which isolates the first electrically conductive portion 52A of the carrier 52 from the second electrically conductive portion 52B. Note that because the substrate 70 is mounted on the isolation portion 54, the cathode 56 of the diode is electrically isolated from the backside 78.

Figure 3C:
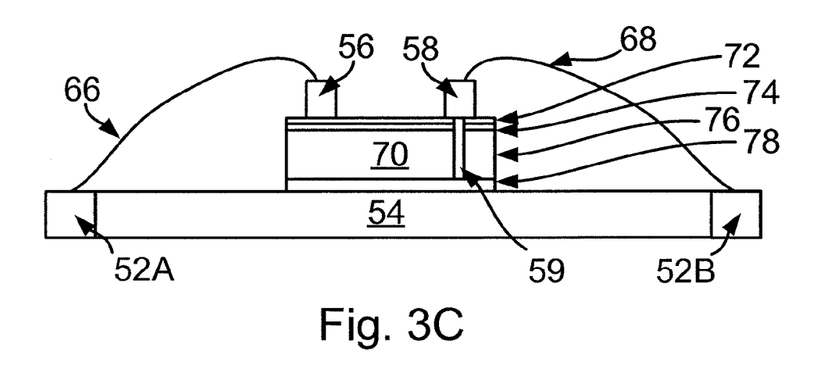

In the example of FIG. 3B, the backside 78 is left floating during operation. However, it may be beneficial to connect the backside 78 of the substrate 70 to the anode 58 of the Schottky diode. FIG. 3C is a cross section that illustrates a first example of how a connection between the backside 78 of the substrate 70 of a device may be connected to the anode 58 of the Schottky diode. The device in FIG. 3C is similar to the device shown in FIG. 3B except as described below. The cross-section in FIG. 3C is again taken through the dotted line 120 in FIG. 3A as explained above.

As can be seen in FIG. 3C, in this embodiment, an electrically conductive connection 59 is provided which passes through the semiconductor substrate 70. The connection 59 may, for example, be a via that passes through the semiconductor substrate 70, and which is filled with an electrically conductive material such as a metal. The connection 59 electrically connects the anode 58 of the device to the backside 78.

In the top view of the device shown in FIG. 3A, it can be seen that the first electrically conductive portion 52A of the carrier 52 extends at least partially around a periphery of the substrate 70. This arrangement of the first electrically conductive portion 52A can enhance the amount of shielding against electromagnetic interference (EMI). In some implementations, metal patterns also extending partially around the periphery of the substrate 70 may be provided on the printed circuit board (PCB) beneath the device (not shown in the Figures).

In the example of FIG. 3A, the first electrically conductive portion 52A extends around a first, second and third side of the substrate 70. Accordingly, in this example, when viewed from above the plane of the substrate, the electrically conductive portion 52A is substantially C-shaped, although other shapes may also be used (e.g. L-shaped).

Figure 4:
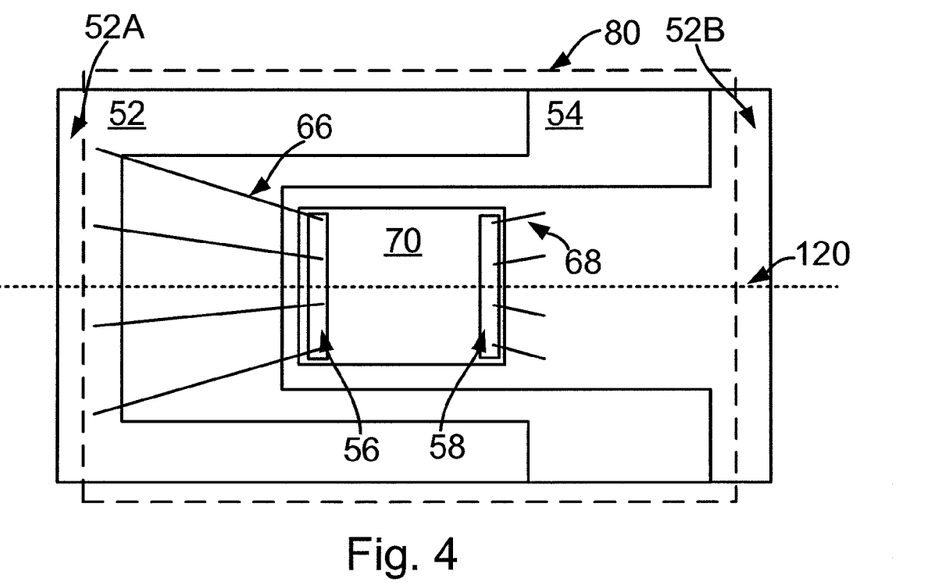
FIG. 4 shows a top view of a semiconductor device in accordance with another embodiment of the invention.

FIG. 4 illustrates another example of a semiconductor device in accordance with an embodiment of this invention. As above, the semiconductor device includes a semiconductor substrate 70 on which is provided a Schottky diode. The internal structure of the substrate 70 may be substantially as shown in FIG. 3B. Again, the device includes bond wires 66 and 68 that electrically connect the cathode 56 and anode 58 of the Schottky diode to a first electrically conductive portion 52A and a second electrically conductive portion 52B of a carrier 52 of the device, respectively.

In this example, the substrate 70 is mounted directly on the second electrically conductive portion 52B of the carrier 52. Accordingly, the backside of the substrate 70 is in electrical communication with the anode of the device, which is also connected to the second electrically conductive portion (by the bond wires 68). Accordingly, this example represents an alternative implementation in which the backside of the substrate 70 is electrically connected to the anode 58 as explained above.

Again, in this embodiment the first conductive portion 52A is electrically isolated from the second electrically conductive portion 52B by intervening isolating portion 54, which again may comprise a moulding compound (encapsulant) of the package 80 of the device. Note that again in this example the cathode is electrically isolated from the backside of the substrate 70.

In common with the device described above in relation to FIG. 3A, in the example of FIG. 4, the first electrically conductive portion 52A extends at least partially around the periphery of the substrate 70 thereby to provide shielding against electromagnetic radiation that may cause electromagnetic interference (EMI). As in FIG. 3A, when viewed from above the plane of the substrate, the electrically conductive portion 52A is substantially C-shaped, although other shapes may also be used (e.g. L-shaped).

Figure 5:
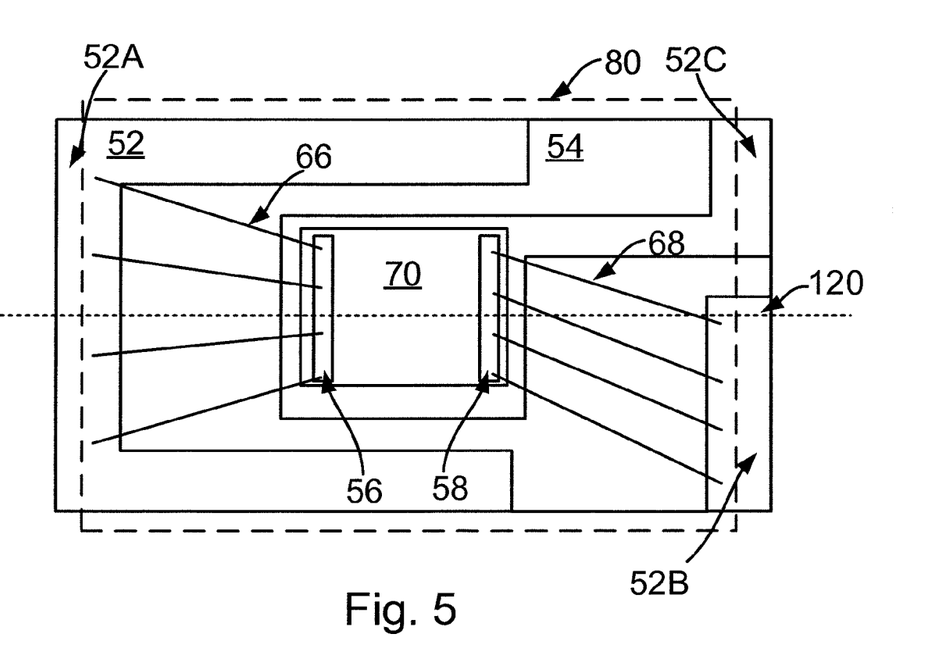
FIG. 5 shows a top view of a semiconductor device in accordance with a further embodiment of the invention.

FIG. 5 illustrates another example of a semiconductor device in accordance with an embodiment of this invention. In this example, the carrier 52 includes a first electrically conductive portion 52A, a second electrically conductive portion 52B and a third electrically conductive portion 52C. As described above in relation to the previous embodiments, the electrically conductive portion 52A of the carrier 52 is connected to a cathode 56 of the Schottky diode provided on the substrate 70 by one or more bond wires 66. Similarly, the anode 58 of the device is connected using bond wires 68 to the second electrically conductive portion 52B.

The third electrically conductive portion 52C in this example extends beneath the substrate 70 so that the substrate is mounted directly on an upper surface thereof. The isolating portion 54 in this example separates each of the three different electrically conductive portions 52A, 52B, 52C from each other. Note that the cathode 56 of the Schottky diode is electrically isolated from the third electrically conductive portion 52C and is also electrically isolated from the backside of the substrate 70.

In this example, an external connection can be made to the electrically conductive portion 52C (for example using an output pin of the package 80), to allow a predetermined potential (for example a ground potential) to be applied to the backside of the substrate 70 through the electrically conductive portion 52C during operation.

In common with the embodiments described above, the electrically conductive portion 52A in this example extends at least partially around a periphery of the substrate 70 to provide a degree of EMI shielding. As in FIGS. 3A and 4, when viewed from above the plane of the substrate, the electrically conductive portion 52A is substantially C-shaped, although other shapes may also be used (e.g. L-shaped).

Figure 6A:
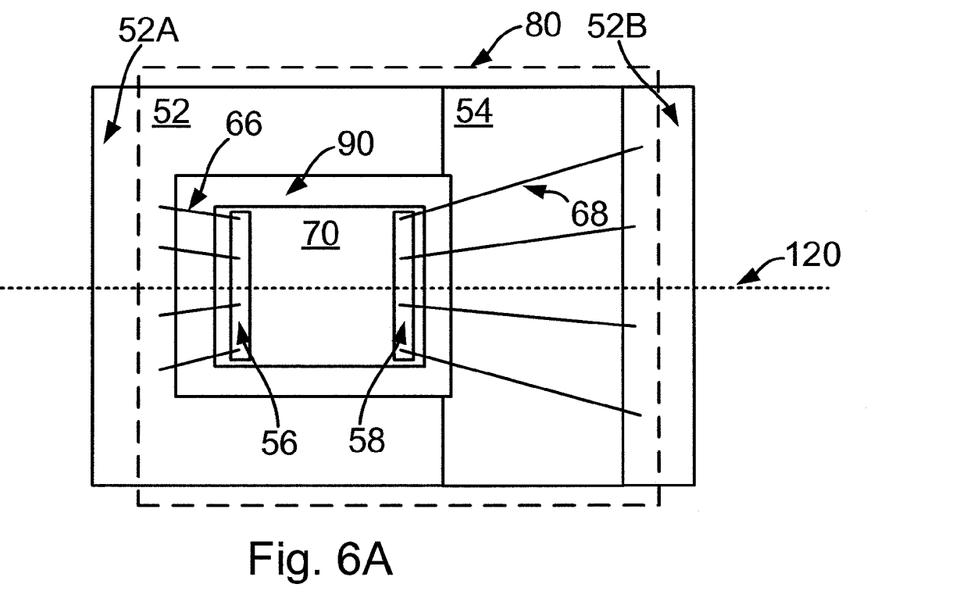
FIG. 6A shows a top view of a semiconductor device in accordance with another embodiment of the invention.
Figure 6B:
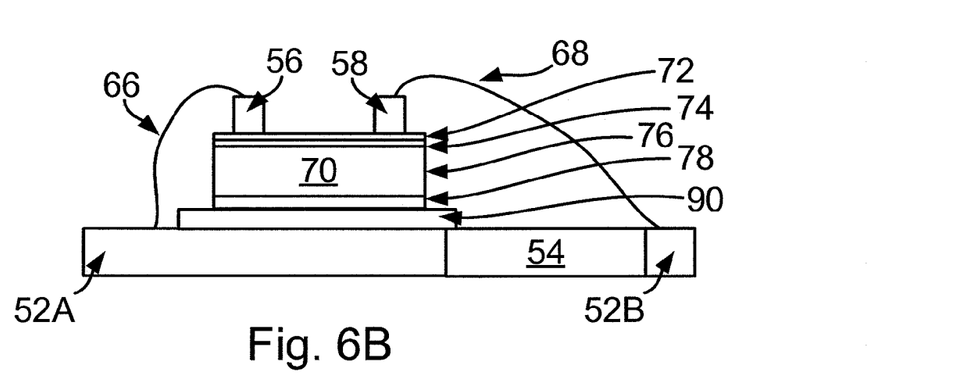
FIGS. 6B and 6C each show a cross section of an example of a semiconductor device of the kind shown in FIG. 6A.

FIGS. 6A and 6B illustrate a semiconductor device according to a further embodiment of this invention. In this example, the device includes a substrate 70 which is mounted on a carrier 52 that includes first and second electrically conductive portions 52A, 52B. Again, a cathode 56 of the Schottky diode is connected using bond wires 66 to the first electrically conductive portion 52A, while an anode 58 of the diode is connected to the electrically conductive portion 52B by bond wires 68.

As can be seen in FIG. 6B, which is a cross-section of the device shown in FIG. 6A along the dotted line labelled 120, the internal structure of the semiconductor substrate 70 may be substantially as described above in relation to, for example, FIG. 3B.

In this example, the first electrically conductive portion 52A of the carrier 52 extends beneath the substrate 70, to enhance the shielding provided against electromagnetic radiation associated with switching of the anode. As the cathode 56 of the device is electrically connected to the first electrically conductive portion 52A by the bond wires 66, in order to electrically isolate the cathode 56 from the backside 78 of the substrate 70, an intervening dielectric 90 is provided between the backside 78 and the first electrically conductive portion 52A of the carrier 52. The intervening dielectric 90, which may be considered to be part of the carrier 52 may, for example, comprise a dielectric layer and/or a non-conducting adhesive that may be used to attach the substrate 70 to the carrier 52. Note that because the first electrically conductive portion 52A extends completely beneath the substrate 70 in this example, a high degree of EMI shielding can be provided.

Figure 6C:
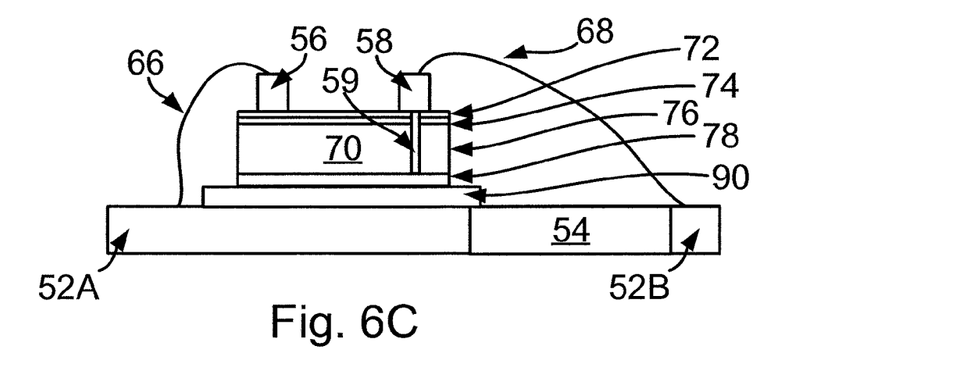

In the example of FIGS. 6A and 6B, in common with the example described above in relation to FIG. 3B, the backside 78 of the semiconductor substrate is left floating during operation of the Schottky diode. In FIG. 6C, however, it is shown that an electrically conductive connection 59 of the kind described above in relation to FIG. 3C may be provided for connecting the anode 58 of the device to the backside 78.

Figure 7A:
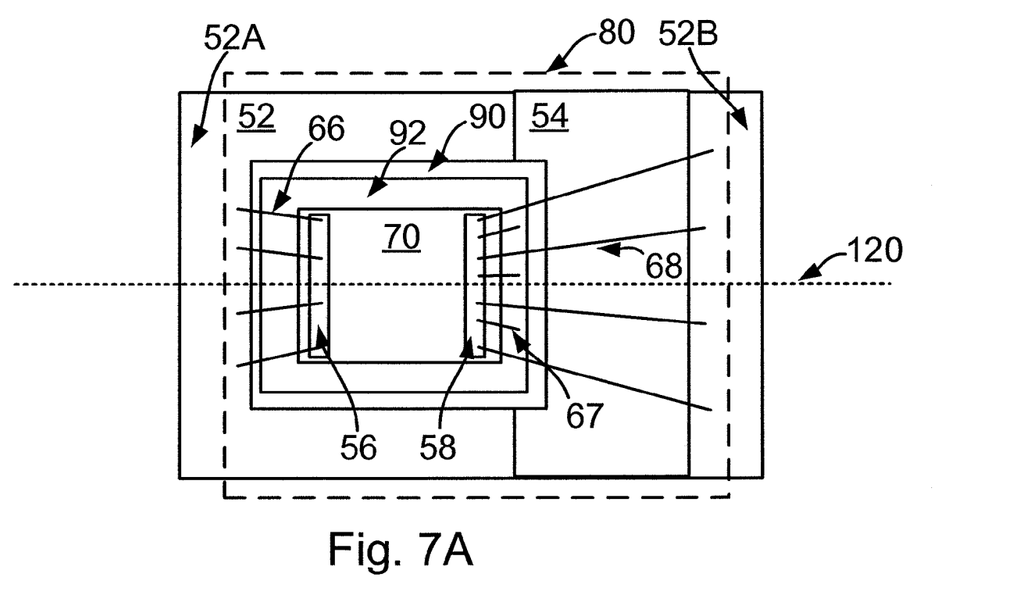
FIG. 7A shows a top view of a semiconductor device in accordance with a further embodiment of the invention.
Figure 7B:
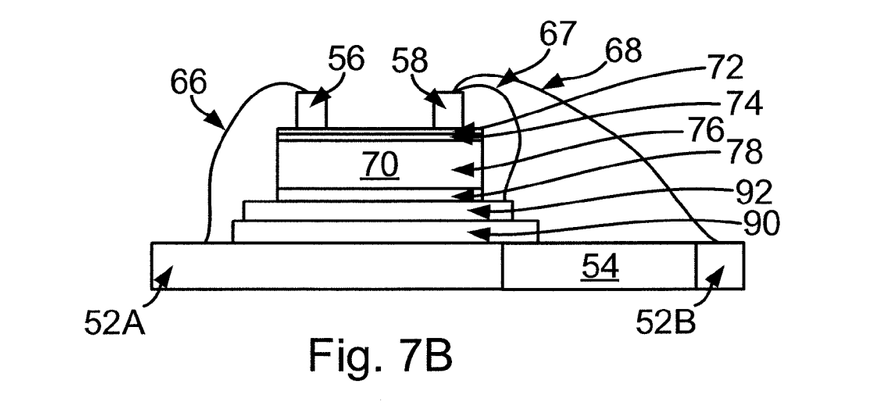
FIG. 7B shows a cross section of the semiconductor device shown in FIG. 7A.

FIGS. 7A and 7B illustrate another example of a semiconductor device in accordance with an embodiment of this invention.

The embodiment shown in FIGS. 7A and 7B is similar in many respects to the embodiment described above in relation to FIG. 6. Additionally, however, in the example of FIGS. 7A and 7B, an electrically conductive mounting portion 92, such as a metal layer, is provided in-between the backside 78 of the substrate 70 and the intervening dielectric 90. A further set of one or more bond wires 67, such as down bond wires, is used to connect the anode 58 of the Schottky diode to the electrically conductive mounting portion 92. Accordingly, this represents another implementation in which the anode 58 may be connected electrically to the backside 78 of the substrate 70. Note that the intervening dielectric 90 still isolates the backside 78 from the cathode 56 of the device by isolating the backside 78 and the electrically conductive mounting portion 92 from the first electrically conductive portion 52A of the carrier 52.

Figure 8:
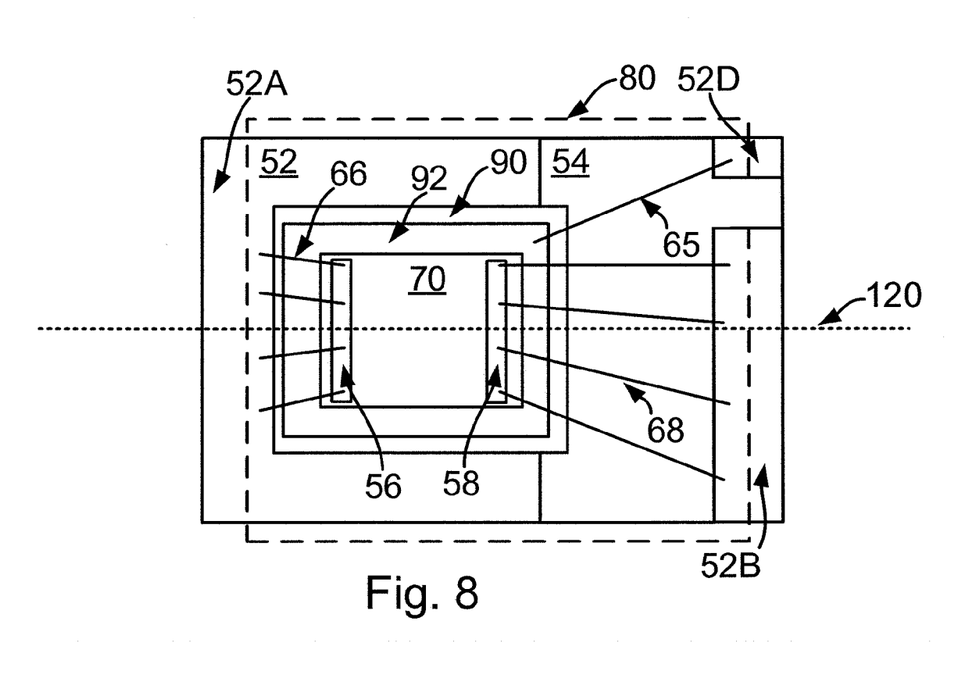
FIG. 8 shows a top view of a semiconductor device in accordance with another embodiment of the invention.

FIG. 8 illustrates another example of a semiconductor device in accordance with an embodiment of this invention. The example in FIG. 8 is similar to the example described above in relation to FIGS. 7A and 7B. For instance, the first electrically conductive portion 52A of the carrier 52 extends completely beneath the substrate 70 to provide good EMI shielding. The cathode 56 of the device is connected to the first electrically conductive portion 52A by the bond wires 66. An intervening dielectric 90 electrically isolates the backside of the substrate 70 from the first electrically conductive portion 52A. The anode 58 of the device is connected to the second electrically conductive portion 52B of the carrier 52 by the bond wires 68.

As in FIGS. 7A and 7B, an electrically conductive mounting portion 92 is provided beneath the backside 78 of the substrate 70. However, in this example, instead of providing down-bond wires from the anode 58 to the electrically conductive mounting portion 92, the electrically conductive mounting portion 92 is connected to a further electrically conductive portion 52D of the carrier 52. The further electrically conductive portion 52D may be connected to the electrically conductive mounting portion 92 one or more bond wires 65. This can allow external connections to be made to the device in order to apply a predetermined potential (such as a ground potential) to the backside of the substrate 70 via the electrically conductive mounting portion 92 upon which the substrate 70 is located.

In the examples described above, the carrier 52 generally comprises a lead frame that may, for instance, include one or more electrically conductive (e.g. metallic) portions that are electrically isolated from each other by an electrically isolating material such as a mould compound (encapsulant). However, it is also envisaged that the carrier included in a semiconductor device in accordance with embodiments of this invention may instead comprise a dielectric substrate having one or more metallised layers. Two examples of this will be described below in relation to FIGS. 9 and 10.

Figure 9:
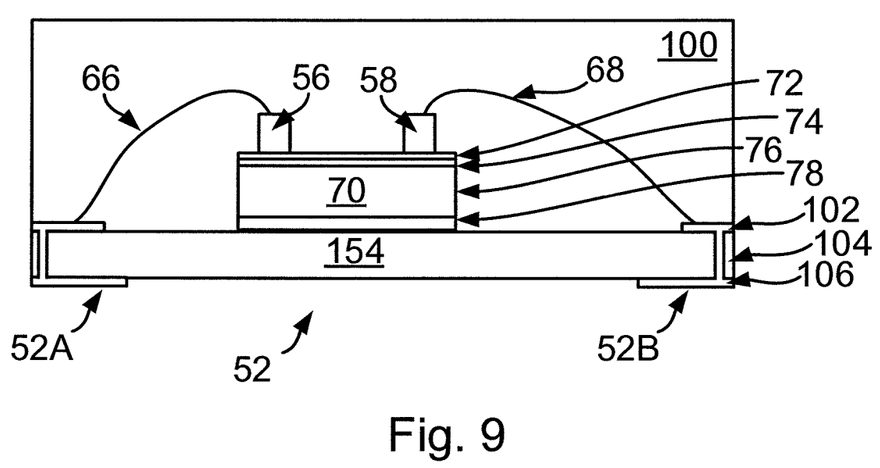
FIG. 9 shows a cross section of a semiconductor device in accordance with a further embodiment of the invention.

In the embodiment of FIG. 9, the semiconductor device includes, as described above, a substrate 70 having various layers, a cathode 56 and an anode 58.

The substrate 70 is mounted on a carrier 52. The carrier 52 includes an isolating substrate 154. The isolating substrate may, for instance, comprise a ceramic or other dielectric material (e.g. aluminium oxide or aluminium nitride). The isolating substrate may, for instance, be laminated, comprising a plurality of different layers. In the example of FIG. 9, the substrate 70 is mounted directly on the isolating substrate 154 and the backside 78 of the substrate 70 is left floating during operation.

The carrier 52 also includes a first electrically conductive portion 52A and a second electrically conductive portion 52B. The cathode 56 of the device is connected to the first electrically conductive portion 52A by one or more bond wires 66, while the anode 58 of the device is connected to the second electrically conductive portion 52B by one or more bond wires 68. In some examples, an encapsulant 100 can be used to encapsulate the substrate 70 and the bond wires 66 and 68 as is known in the art.

The first electrically conductive portion 52A and the second electrically conductive portion 52B can include one or more metal layers 102, 106 which may be provided on surfaces of the isolating substrate 154. If desired, electrical connections 104 such as vias filled with metallic material may pass through the isolating substrate 154 in order to interconnect the various metal layers.

The layout of the metal layers such as the layers 102 shown in FIG. 9 may be chosen to implement layouts of the kind described above in relation to FIGS. 3-8. Accordingly, it will be appreciated that each of the implementations noted in the above-referenced Figures may also be applied to embodiments in which the carrier does not include a lead frame but instead includes a isolating substrate 154 and one or more metal features such as the metal layers 102 as shown in FIG. 9. For instance, it is envisaged that metal layers forming the first electrically conductive portion 52A of the carrier 52 may at least partially extend around the substrate 70 as described above in relation to, for example, FIG. 3A. It is also envisaged that the metal layers may form a further electrically conductive portion for connection of an external potential to the backside 78 of the substrate 70 as described in relation to FIG. 5. It is further envisaged that the metal layers forming the electrically conductive portion 52B may extend beneath the backside 78 so that the anode 58 of the device is connected to the backside 78 as described above in relation to, for example, FIG. 4. In other embodiments, it is envisaged that an electrical connection of the kind described in relation to FIG. 3C, passing through the substrate 70 may be used to connect the anode to the backside 78 instead.

In another example, the metal layers forming the electrically conductive portion 52A shown in FIG. 9 may extend completely beneath the substrate 70 in order to provide good EMI shielding. In such examples, an intervening dielectric of the kind described above in relation to FIG. 6A may be used to isolate the cathode 56 from the backside 78. In yet a further example, an electrically conductive portion of the kind described above in relation to FIG. 7A may allow the electrically conductive portion 52A to extend beneath the substrate 70 while isolating the electrically conductive portion 52A from the backside 78 using an intervening dielectric 90 and while still allowing down bonds to be made to connect the anode 58 to the backside 78. In yet another example, as described above in relation to FIG. 8, the metal layers of FIG. 9 forming the electrically conductive portion 52A may extend completely beneath the substrate 70 and metal layers of the carrier 52 may form a further connection connected to a metal layer beneath the substrate 70 but on top of the intervening dielectric 90 shown in FIG. 8 to allow connection to an external, predetermined potential.

Figure 10:
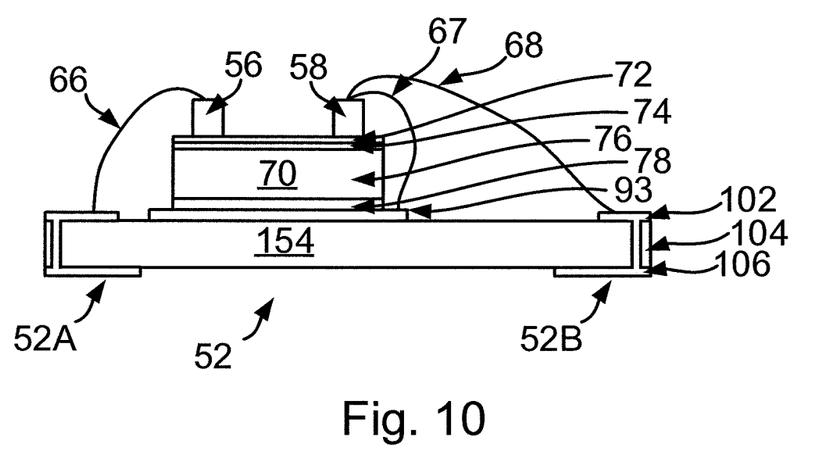
FIG. 10 shows a cross section of a semiconductor device in accordance with another embodiment of the invention.

A further example is shown in FIG. 10. In this example, although the electrically conductive portion 52A does not extend beneath the substrate 70, it may in some implementations at least partially enclose the substrate when viewed from above, thereby to provide good EMI shielding. In the example of FIG. 10, the carrier 52 includes a metal layer 93 upon which the backside 78 of the substrate 70 is mounted, so that the backside 78 is in electrical communication with the metal layer 93. A down bond 67 is made from the anode 58 to the metal layer 93 so that the anode 58 is electrically connected to the backside 78.

A method of making a semiconductor device according to an embodiment of this invention can include mounting a semiconductor substrate on a carrier of the kind described above. The substrate includes a Schottky diode. The Schottky diode has an anode and a cathode. The method can also include connecting one or more bond wires to the anode in order to form connections of the kind described above in relation to the FIGS. 3-10. The method can further include connecting one or more bond wires to the cathode, again to form the connection described above in relation to FIGS. 3-10. As noted above, the method of making a semiconductor device according to this embodiment results in a device in which the cathode is electrically isolated from a backside of the semiconductor substrate.

Accordingly, there has been described a semiconductor device and a method of making the same. The semiconductor device includes a semiconductor substrate mounted on a carrier. The semiconductor substrate includes a Schottky diode. The Schottky diode has an anode and a cathode. The semiconductor device also includes one or more bond wires connecting the cathode to a first electrically conductive portion of the carrier. The semiconductor device further includes one or more bond wires connecting the anode to a second electrically conductive portion of the carrier. The first electrically conductive portion of the carrier is electrically isolated from the second electrically conductive portion of the carrier. The first electrically conductive portion of the carrier is configured to provide shielding against electromagnetic interference associated with switching of the anode during operation of the device. Both the cathode and the first electrically conductive portion of the carrier are electrically isolated from a backside of the semiconductor substrate.

Although particular embodiments of the invention have been described, it will be appreciated that many modifications/additions and/or substitutions may be made within the scope of the claimed invention.

The invention claimed is:

1. A semiconductor device comprising:
    a semiconductor substrate mounted on a carrier, the semiconductor substrate including a Schottky diode, the Schottky diode having an anode and a cathode;
    one or more bond wires connecting the cathode to a first electrically conductive portion of the carrier; and
    one or more bond wires connecting the anode to a second electrically conductive portion of the carrier,
    wherein the first electrically conductive portion of the carrier is electrically isolated from the second electrically conductive portion of the carrier,
    wherein the first electrically conductive portion of the carrier is configured to provide shielding against electromagnetic interference associated with switching of the anode during operation of the device, and
    wherein both the cathode and the first electrically conductive portion of the carrier are electrically isolated from a backside of the semiconductor substrate.

2. The semiconductor device of claim 1, wherein the anode is electrically connected to the backside of the semiconductor substrate.

3. The semiconductor device of claim 2, wherein the anode is electrically connected to the backside of the semiconductor substrate by an electrically conductive connection passing through the semiconductor substrate.

4. The semiconductor device of claim 3, wherein the electrically conductive connection passing through the semiconductor substrate comprises a via filled with an electrically conductive material.

5. The semiconductor device of claim 2, wherein the backside of the semiconductor substrate is mounted on an electrically conductive mounting portion that is isolated from both the cathode and the first electrically conductive portion of the carrier, and wherein the anode is electrically connected to said electrically conductive mounting portion.

6. The semiconductor device of claim 5, wherein the anode is electrically connected to the electrically conductive mounting portion by a down-bond wire.

7. The semiconductor device of claim 1, wherein the carrier comprises a lead frame.

8. The semiconductor device of claim 1, wherein the carrier comprises a dielectric substrate having one or more metallized layers.

9. The semiconductor device of claim 1, wherein the backside of the semiconductor substrate is electrically connected to an output connection for applying a potential to the backside of the substrate.

10. The semiconductor device of claim 1, wherein the backside of the substrate is electrically isolated from the carrier by an intervening dielectric.

11. The semiconductor device of claim 1, wherein the first electrically conductive portion of the carrier extends at least partially around a periphery of the substrate to provide shielding against electromagnetic interference associated with switching of the anode during operation of the device.

12. The semiconductor device of claim 1, wherein the first electrically conductive portion of the carrier extends at least partially beneath the substrate to provide shielding against electromagnetic interference associated with switching of the anode during operation of the device.

13. The semiconductor device of claim 1, wherein the Schottky diode is a GaN/AlGaN diode.

14. A power amplifier comprising the semiconductor device of claim 1.

15. A method of making a semiconductor device, the method comprising:
    mounting a semiconductor substrate on a carrier, the substrate including a Schottky diode, the Schottky diode having an anode and a cathode;
    connecting the cathode to a first electrically conductive portion of the carrier using one or more bond wires; and
    connecting the anode to a second electrically conductive portion of the carrier using one or more bond wires,
    wherein the first electrically conductive portion of the carrier is electrically isolated from the second electrically conductive portion of the carrier,
    wherein the first electrically conductive portion of the carrier is configured to provide shielding against electromagnetic interference associated with switching of the anode during operation of the device, and
    wherein both the cathode and the first electrically conductive portion of the carrier are electrically isolated from a backside of the semiconductor substrate.

* * * * *